US007072007B2

(12) United States Patent
Kaneko

(10) Patent No.: US 7,072,007 B2
(45) Date of Patent: Jul. 4, 2006

(54) FLAT DISPLAY PANEL HAVING BACKSIDE FIXED TO CHASSIS BY ADHESIVE TAPES INCLUDING DOUBLE-SIDED AND SINGLE-SIDED ADHESIVE TAPE

(75) Inventor: Koichi Kaneko, Shizuoka (JP)

(73) Assignee: Pioneer Corporation, Tokyo (JP)

( * ) Notice: Subject to any disclaimer, the term of this patent is extended or adjusted under 35 U.S.C. 154(b) by 169 days.

(21) Appl. No.: 10/880,542

(22) Filed: Jul. 1, 2004

(65) Prior Publication Data

US 2005/0001950 A1 Jan. 6, 2005

(30) Foreign Application Priority Data

Jul. 2, 2003 (JP) .......................... P2003-190060

(51) Int. Cl.
*G02F 1/1333* (2006.01)

(52) U.S. Cl. ........................................................ 349/58

(58) Field of Classification Search .................... 349/58
See application file for complete search history.

(56) References Cited

U.S. PATENT DOCUMENTS 6,515,721 B1 * 2/2003 Jin et al. ........................ 349/58
2002/0127363 A1 * 9/2002 Kaneko et al. ............ 428/40.1

FOREIGN PATENT DOCUMENTS

JP 2002-268577 A 9/2002

* cited by examiner

*Primary Examiner*—Tarifur R. Chowdhury
(74) *Attorney, Agent, or Firm*—Sughrue Mion, PLLC

(57) ABSTRACT

In a plasma display apparatus, a back face of a flat type Plasma Display Panel (hereinafter, referred as PDP) is fixed to a chassis member by at least one of adhesive tapes including a double-sided adhesive tape and a single-sided adhesive tape. In the double-sided adhesive tape and the single-sided adhesive tape, a total area of the adhesive surface of the double-sided adhesive tape is adjusted to adjust a bonding strength between the PDP and the chassis member to a predetermined value, and also to ensure a contact area for heat conduction.

3 Claims, 5 Drawing Sheets

FLAT DISPLAY PANEL HAVING BACKSIDE FIXED TO CHASSIS BY ADHESIVE TAPES INCLUDING DOUBLE-SIDED AND SINGLE-SIDED ADHESIVE TAPE

BACKGROUND OF THE INVENTION

1. Filed of the Invention

The present invention relates to a flat display apparatus.

2. Description of the Related Art

Recently, various flat display apparatuses using a plate-like thin display panel such as a plasma display panel (hereinafter, abbreviated to PDP), a liquid crystal display panel, or an organic electroluminescence display panel are being developed.

FIG. 1 shows an example of the whole configuration of a plasma display apparatus in which such a PDP is incorporated.

As shown in the figure, a case which houses a PDP 1 is configured by a front face frame 6 in which a front face cover made of glass or the like is placed in an opening, and a rear cover 7 made of a metal.

The PDP 1 is bonded via a heat conductive sheet 8 to a front face of a chassis member 3 made of an aluminum alloy or the like, to be held thereby. A plurality of circuit blocks (circuit boards) 2 such as a scanning circuit board on which a driving circuit for driving the displaying operation of the PDP 1, and a driving circuit board on which a power supply circuit for supplying an electric power to the driving circuit are attached to the rear face of the chassis member 3.

The heat conductive sheet 8 efficiently conducts heat generated by the PDP 1 to the chassis member 3 so that the heat is radiated therefrom. The chassis member 3 is requested to perform a function of serving as a holding member for holding the PDP 1, and also a further function of radiating the heat generated by the PDP 1 to cool the PDP 1.

FIGS. 2 and 3 show the structure for connecting the PDP 1 with the chassis member 3 in the conventional example of a flat display apparatus.

As shown in the figures, the PDP 1 is configured by bonding a front face glass substrate 1A to a back face glass substrate 1B via a discharge space 1C. The circuit boards 2 for driving the PDP 1 are mounted on the PDP via the chassis member 3.

The chassis member 3 is a plate-like member made of a metal such as an aluminum alloy having a high heat conductivity. The PDP 1 and the circuit boards 2 are electrically connected to each other through a flexible cable 4. As shown in FIG. 3, the chassis member 3 and the PDP 1 are fixed to each other by a plurality of double-sided adhesive tapes 5 which are bonded to the outer face of the back face glass substrate 1B of the PDP 1 (the back face of the PDP 1).

Recently, in order to reduce industrial waste and economize raw material resources, a recycling process of recovering used products, disassembling them, and returning glass and metal parts to resources becomes an important issue in various industrial fields.

In the thus configured flat display apparatus also, therefore, it is contemplated that the display panel formed by a glass substrate, and the chassis member made of a metal such as an aluminum alloy are separated from each other to be recycled.

However, the above-described flat display apparatus has problems. One of the problems is as follows. Usually, the double-sided adhesive tapes 5 which are used for bonding the PDP 1 to the chassis member 3 are formed by stacking adhesive layers of acrylic paste or the like on both surfaces of a tape backing formed by an acrylic film or the like, and exert a high adhesive force. In order to peel off the double-sided adhesive tapes 5, therefore, a special peeling method using a solvent, a heating treatment, or a water pressure is required. This causes a problem in that the cost for recycling is increased.

When a failure occurs in the PDP 1 in a production line or the PDP is to be repaired after shipment, it is difficult to separate the PDP 1 from the chassis member 3, thereby causing another problem in that a work of replacing a faulty component cannot be easily conducted.

Therefore, a countermeasure has been considered in which plural double-sided adhesive tapes are applied with forming large application intervals so as to reduce the region (area) where actual bonding is performed, thereby saving the trouble of peeling off the double-sided adhesive tapes. In the countermeasure, in a region where the double-sided adhesive tapes are not applied, a gap is formed between a display panel and a chassis member, thereby causing a problem in that the formation of the gap reduces the amount of heat conduction from the display panel to the chassis member. Moreover, a temperature difference is produced between the applied portion where the display panel and the chassis member are in contact with each other via the double-sided adhesive tapes, and the non-applied portion where the double-sided adhesive tapes do not exist and the gap is formed, thereby causing thermal stress and strain in the display panel. This may adversely affect the display characteristics.

In order to solve the problems, a configuration has been proposed in which a material having an excellent shrink property is used as tape backings of double-sided adhesive tapes for bonding and fixing the back face of a display panel to a chassis member, and the adhesive forces of adhesive layers to be stacked on both surfaces of each tape backing are weakened. In this configuration, when a tension of a given level or higher in the longitudinal direction is applied to ends of the applied double-sided adhesive tapes, the tapes can be easily peeled off (for example, see JP-A-2002-268577).

In this case, while a necessary area is ensured between the display panel and the chassis member, the peeling work is facilitated, and the disassembling work for recycling, and the work of replacing components can be easily conducted.

In the double-sided adhesive tape disclosed in JP-A-2002-268577, a polymer foam layer or a polymer film layer is used as the tape backing to ensure a breaking elongation of 300% or more. Since the polymer foam layer or the polymer film layer is made of an acrylic polymer, polyurethane, or a combination of these materials, the layer is highly thermally insulative. Therefore, there is a problem in that it is difficult to rapidly conduct heat generated by the display panel to the chassis member.

The double-sided adhesive tape disclosed in JP-A-2002-268577, and the conventional double-sided adhesive tape 5 in which an acrylic film is used as the tape backing have another problem as follows. In the case where the tape is densely laid to ensure a large adhesive surface, the connection state between the PDP 1 and the chassis member 3 due to adhesion becomes rigid and stiff. When an external impact force is applied to the chassis member 3 during transportation or the like, therefore, the impact force is directly transmitted to the display panel via the adhesive layer of the double-sided adhesive tape, thereby causing the possibility that the display panel is broken.

SUMMARY OF THE INVENTION

It is an object of the invention to provide with a flat display apparatus including: a chassis member and a flat display panel having a back face which is fixed to the chassis member by adhesive tapes, wherein the adhesive tapes include at least one double-sided adhesive tape and at least one single-sided adhesive tape, and a bonding strength between the display panel and the chassis member is adjusted to a predetermined value by adjusting a total area of adhesive surface of the at least one double-sided adhesive tape together with ensuing a contact area between the display panel and the chassis member for heat conduction.

BRIEF DESCRIPTION OF THE DRAWINGS

These and other objects and advantages of this invention will become more fully apparent from the following detailed description taken with the accompanying drawings in which.

DESCRIPTION OF THE PREFERRED EMBODIMENTS

Figure 1:
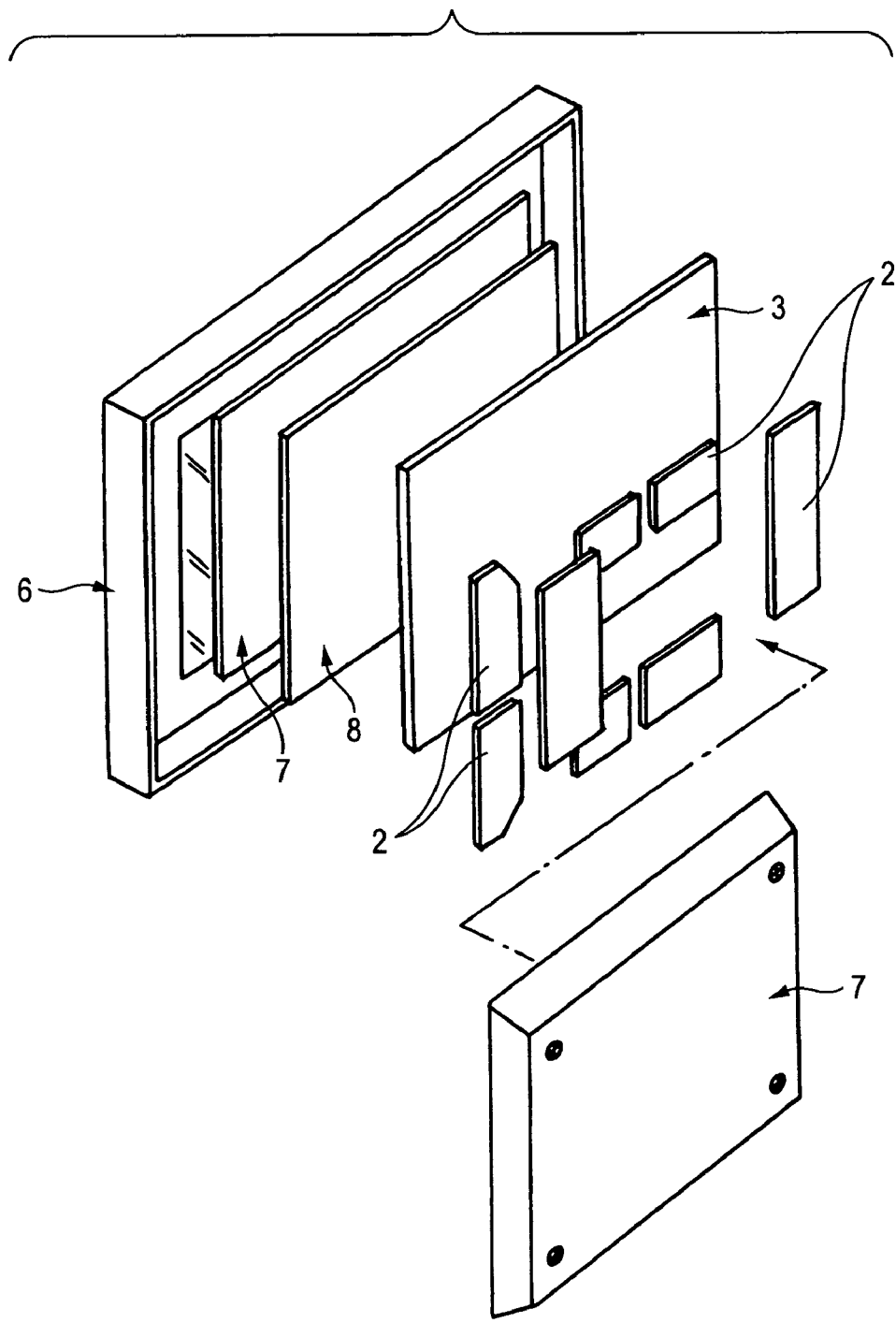
FIG. 1 is an exploded perspective view showing an example of the whole configuration of a flat display apparatus in the related art.
Figure 2:
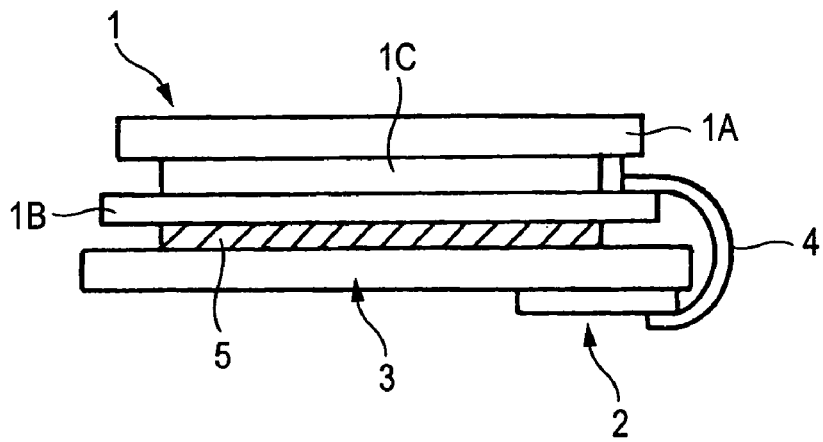
FIG. 2 is a side view showing the structure for connecting a display panel with a chassis member in the flat display apparatus in the related art.
Figure 3:
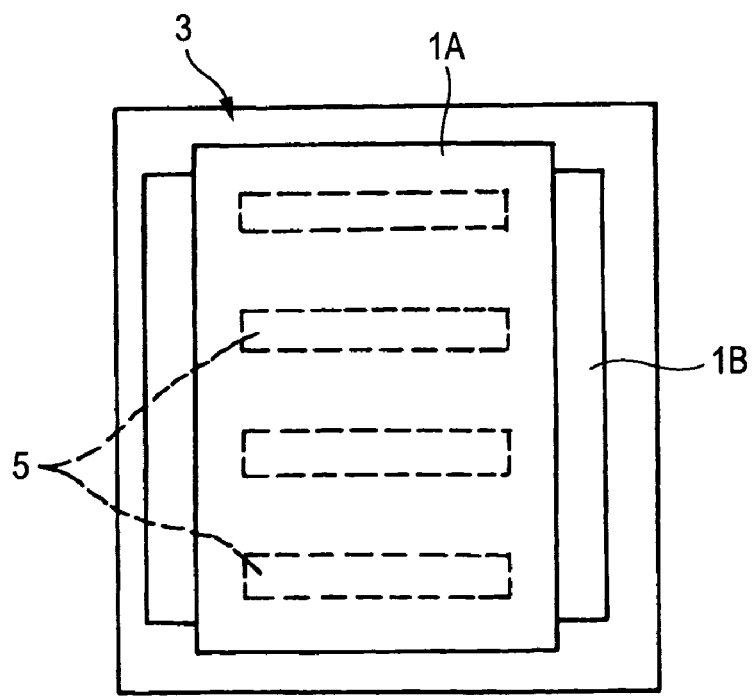
FIG. 3 is a plan view of the flat display apparatus shown in FIG. 2.

Embodiments of the flat display apparatus of the invention will be described.

A flat display apparatus of a first embodiment is a flat display apparatus in which the back face of a flat display panel is fixed to a chassis member by a plurality of adhesive tapes, wherein the adhesive tapes include double-sided adhesive tapes and single-sided adhesive tapes, and the total area of adhesive surfaces of the double-sided adhesive tapes is adjusted to adjust the bonding strength between the display panel and the chassis member to a predetermined value, and also to ensure a contact area for heat conduction.

According to the configuration, when the total area of the adhesive surfaces of the double-sided adhesive tapes is adjusted, it is possible to ensure the contact area for heat conduction while adjusting the bonding strength between the display panel and the chassis member to the predetermined value.

Therefore, an external impact force applied to the chassis member is hardly directly transmitted to the display panel, and the disassembling work for recycling, and the work of replacing components can be easily conducted.

In a flat display apparatus of a second embodiment, the double-sided adhesive tapes are tapes in each of which adhesive layers are formed on both surfaces of a tape backing having a heat conductivity and a buffer property, by applying double-sided adhesive tape members with nonwoven fabric to the surfaces of the tape backing, respectively, and the single-sided adhesive tapes are tapes in which an adhesive layer is formed on only one surface of a tape backing having a heat conductivity and a buffer property, by applying a double-sided adhesive tape member with nonwoven fabric to the one surface of the tape backing.

According to the configuration, when, for example, an end of each of the double-sided adhesive tapes and the single-sided adhesive tapes is pulled, nonwoven fabric fibers in the double-sided adhesive tape member with nonwoven fabric restrict the elastic elongation of the adhesive layers, and the tensile stress acting on the tape end efficiently functions as a shearing force which causes the bonding surfaces to be easily peeled off. Therefore, the tape can be easily peeled off simply by pulling an end of the tape.

In the double-sided adhesive tapes and the single-sided adhesive tapes, a material having a heat conductivity is used as the tape backing. When plural numbers of the double-sided adhesive tapes and the single-sided adhesive tapes are densely arranged in a mixed manner, therefore, the contact area relating to heat conduction can be increased so that excellent heat conductivity can be ensured in the adhesive layers between the display panel and the chassis member.

In the double-sided adhesive tapes and the single-sided adhesive tapes, furthermore, the material used as the tape backing has also a buffer property. In the case where plural numbers of the double-sided adhesive tapes and the single-sided adhesive tapes are densely arranged in a mixed manner, when regions where the single-sided adhesive tapes are applied are suitably dispersed, therefore, an adequate degree of freedom in elasticity can be ensured without causing the connection state between the display panel and the chassis member due to adhesion of the adhesive layers to become stiff.

Preferably, the tape backing is made of silicone rubber as set forth in claim 3.

EXAMPLES

Hereinafter, a flat display apparatus of an example of the invention will be described in detail with reference to the accompanying drawings.

Figure 4:
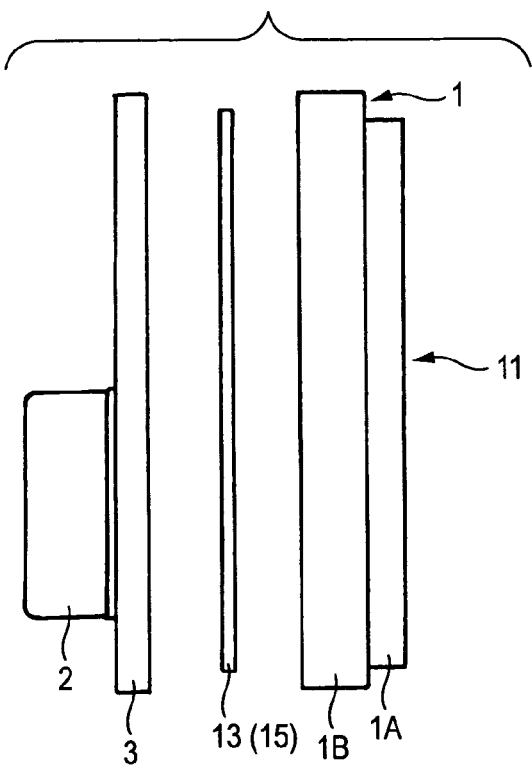
FIG. 4 is an exploded side view of main portions of a flat display apparatus of an example of the invention.
Figure 5:
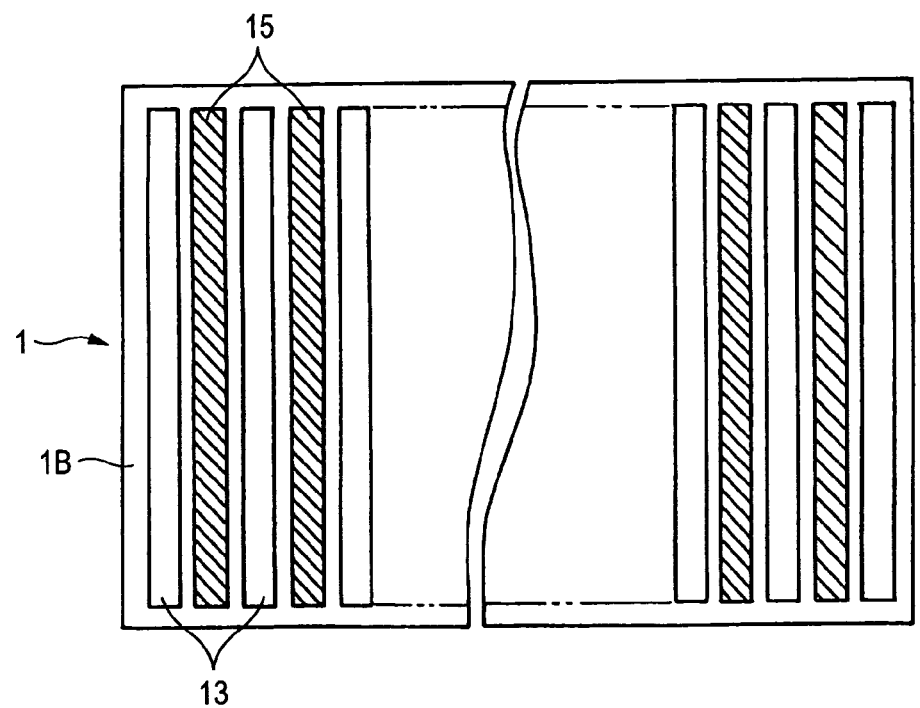
FIG. 5 is a rear view of the display panel of FIG. 4 showing a state where plural double-sided adhesive tapes and single-sided adhesive tapes are applied to the back face of the display panel.

FIG. 4 is an exploded side view of main portions of the flat display apparatus of the example of the invention, and FIG. 5 is a rear view of the display panel of FIG. 4 showing a state where plural double-sided adhesive tapes and single-sided adhesive tapes are applied to the back face of the display panel. The flat display apparatus of the example is a plasma display apparatus in which a PDP (plasma Display Panel) 1 is incorporated, and the whole configuration of the apparatus is approximately similar to that of the plasma display apparatus shown in FIG. 1.

In the plasma display apparatus 11 of the example, as shown in FIGS. 4 and 5, the back face of the flat type PDP 1 is fixed to the chassis member 3 by a plurality of adhesive tapes or double-sided adhesive tapes 13 and single-sided adhesive tapes 15.

The PDP 1 is configured by bonding the front face glass substrate 1A to the back face glass substrate 1B via a discharge space (not shown). In the PDP 1, the circuit boards 2 for driving the PDP are mounted on the rear face of the chassis member 3.

The chassis member 3 is a plate-like member made of a metal such as an aluminum alloy having a high heat conductivity. The PDP 1 and the circuit boards 2 are electrically connected to each other through a flexible cable which is not shown.

Figure 6A:
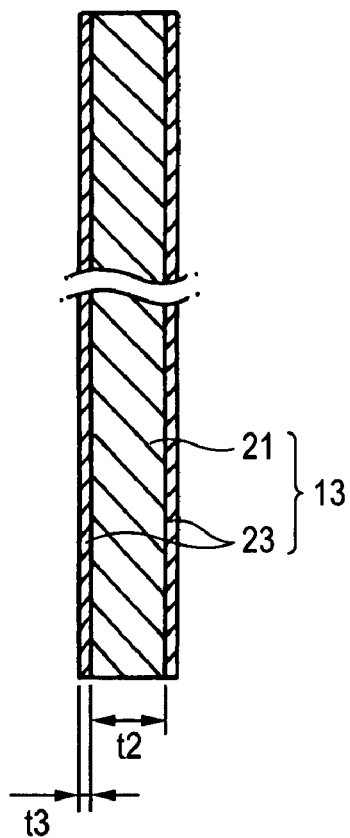
FIG. 6A is a longitudinal section view showing the structure of the double-sided adhesive tape shown in FIG. 5.

In each of the double-sided adhesive tapes 13, as shown in FIG. 6A, double-sided adhesive tape members 23 with nonwoven fabric are applied to both surfaces of a tape backing 21 having a heat conductivity and a buffer property, respectively, whereby an adhesive layer is formed on each of the surfaces of the tape backing 21.

Each of the double-sided adhesive tape members 23 is formed, for example, by impregnating both surfaces of nonwoven fabric having a predetermined tensile strength with acrylic paste, and applying acrylic paste to the surfaces. The tensile strength of the nonwoven fabric is set so as to be larger than the adhesive force of the acrylic paste.

The tape backing 21 is made of silicone rubber having a heat conductivity and a buffer property which are previously determined.

Figure 6B:
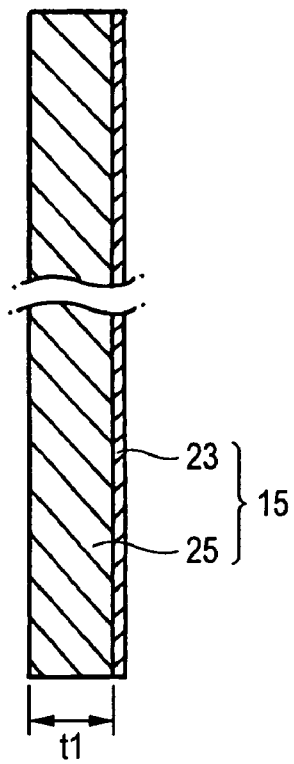
FIG. 6B is a longitudinal section view showing the structure of the single-sided adhesive tape shown in FIG. 5.

In each of the single-sided adhesive tapes 15, as shown in FIG. 6B, a double-sided adhesive tape member 23 with nonwoven fabric is applied to only one surface of a tape backing 25 made of the same material as the tape backing 21, whereby an adhesive layer is formed on only the one surface of the tape backing 25.

In order to equalize the thickness of the double-sided adhesive tapes 13 with that of the single-sided adhesive tapes 15, the thickness t1 of the tape backing 25 of each of the single-sided adhesive tapes 15 in the example is set to be equal to a sum of the thickness t2 of the tape backing 21 of each of the double-sided adhesive tapes 13 and the thickness t3 of one of the double-sided adhesive tape members 23 with nonwoven fabric.

This thickness relationship is set in order to prevent gaps which may impede heat conduction, from being formed between the PDP and the chassis member 3 because of different thicknesses of the double-sided adhesive tapes 13 and the single-sided adhesive tapes 15.

As shown in FIG. 5, the single-sided adhesive tapes 15 are suitably disposed among the arranged double-sided adhesive tapes 13 so that the double-sided adhesive tapes 13 and the single-sided adhesive tapes 15 are relatively densely arranged in a mixed manner on the back face of the PDP 1.

When the ratio of the double-sided adhesive tapes 13 to the single-sided adhesive tapes 15 to be applied to the back face of the PDP 1 is suitably selected, the total area of the adhesive surfaces of the used double-sided adhesive tapes 13 is adjusted so that the bonding strength between the PDP 1 and the chassis member 3 is adjusted to a predetermined value, and the contact area for heat conduction is ensured by the dense tape arrangement.

In the above-described plasma display apparatus of the example, when, for example, an end of each of the double-sided adhesive tapes 13 and the single-sided adhesive tapes 15 is pulled, nonwoven fabric fibers in the double-sided adhesive tape member 23 with nonwoven fabric restrict the elastic elongation of the adhesive layers, and the tensile stress acting on the tape end efficiently functions as a shearing force which causes the bonding surfaces to be peeled off. Therefore, the tapes can be easily peeled off simply by pulling ends of the tapes.

Namely, a process of peeling off the double-sided adhesive tapes 13 and the single-sided adhesive tapes 15 does not require a special peeling methods like using a solvent, a heating treatment, or a water pressure, and the tapes can be easily peeled off. Therefore, the PDP 1 and the chassis member 3 can be easily separated from each other so as to be subjected to recycling.

In the double-sided adhesive tapes 13 and the single-sided adhesive tapes 15, moreover, silicone rubber having a heat conductivity is used as the tape backings 21, 25. When plural numbers of the double-sided adhesive tapes 13 and the single-sided adhesive tapes 15 are densely arranged in a mixed manner, therefore, the contact area relating to heat conduction can be increased so that excellent heat conductivity can be ensured in the adhesive layers between the PDP 1 and the chassis member 3.

Consequently, the heat generated by the PDP 1 can be dissipated toward the chassis member 3 to prevent the temperature distribution from being dispersed, whereby the temperature is stabilized so that the stabilized display characteristics of the PDP 1 can be maintained.

In the double-sided adhesive tapes 13 and the single-sided adhesive tapes 15, moreover, silicone rubber having also a buffer property is used as the tape backings 21, 25. In the case where plural numbers of the double-sided adhesive tapes 13 and the single-sided adhesive tapes 15 are densely arranged in a mixed manner, when regions where the single-sided adhesive tapes 15 are applied are suitably dispersed, therefore, an adequate degree of freedom in elasticity can be ensured without causing the connection state between the PDP 1 and the chassis member 3 due to adhesion of the adhesive layers to become stiff.

Even when an external impact force is applied to the chassis member 3 during transportation or the like, therefore, the buffering effect of the tape backings 21 can cause the impact force to be hardly transmitted to the PDP 1, and the impact resistance can be improved.

Silicone rubber is excellent in heat resistance and heat conductivity and has a high buffer property due to elasticity. From the viewpoint that a necessary buffer property is obtained while ensuring a required heat conductivity in the bonding layers between the PDP 1 and the chassis member 3, therefore, silicone rubber is suitable as the tape backings 21. However, the material of the tape backings 21 is not restricted to silicone rubber. It is a matter of course that a material of any other kind can be used as far as the heat conductivity and buffer property of the material are at a similar level as those of silicone rubber.

In each of the single-sided adhesive tapes 15 in the example, the double-sided adhesive tape member 23 with nonwoven fabric is disposed on one surface of the tape backing 25 having the thickness t1.

Figure 7:
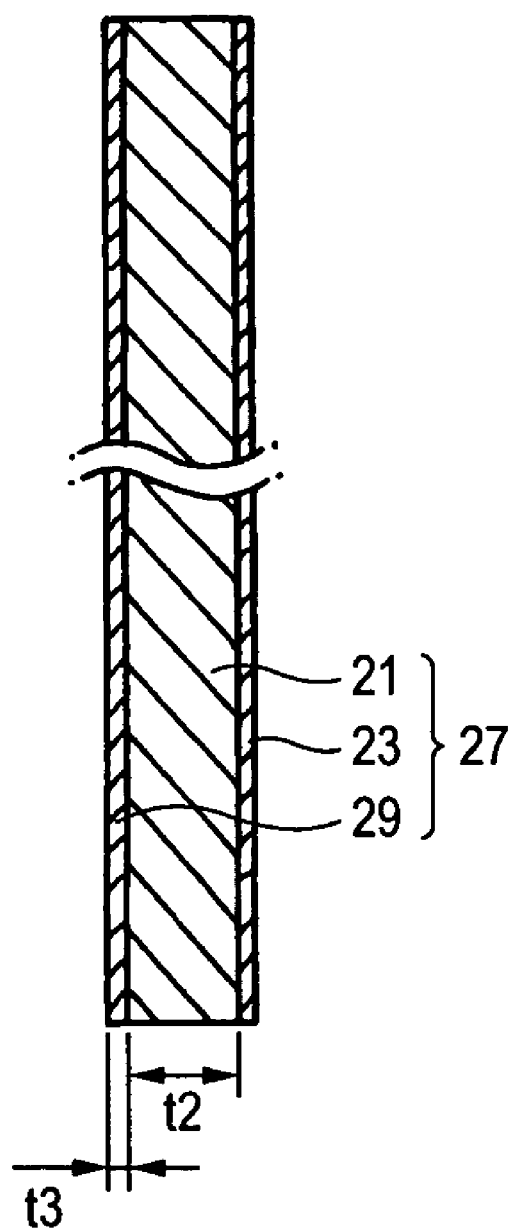
FIG. 7 is a longitudinal section view showing a modification of the single-sided adhesive tape shown in FIG. 6.

Alternatively, as in a single-sided adhesive tape 27 shown in FIG. 7, for example, the double-sided adhesive tape member 23 may be applied to one surface of the tape backing 21 having the thickness t2 which is equal to that of the double-sided adhesive tapes 13, and a single-sided adhesive tape member 29 which is equal in thickness to the double-sided adhesive tape member 23 may be applied to the other surface, whereby a structure the thickness of which is equal to that of the double-sided adhesive tapes 13, and in which an adhesive layer is formed only on one surface can be ensured.

When the single-sided adhesive tapes which are to be arranged mixedly with the double-sided adhesive tapes 13 have the structure of the single-sided adhesive tape 27 shown in FIG. 7, the tape backings 21 can be commonly used in both the double-sided adhesive tapes 13 and the single-sided adhesive tape 27. As compared with the case where the tape backings 21 and the tape backings 25 which have a small size difference therebetween are mixedly managed, the parts management can be facilitated.

The flat display apparatus to which the invention can be applied is not restricted to the plasma display apparatus which has been described as the example, and the invention may be applied also to a flat display apparatus in which a flat display panel of another kind such as a liquid crystal display panel or an organic electroluminescence display panel is mounted.

In the plasma display apparatus 11 which is a flat display apparatus according to the invention, the back face of the flat type PDP 1 is fixed to the chassis member 3 by the double-sided adhesive tapes 13 and the single-sided adhesive tapes 15. In the double-sided adhesive tapes 13 and the single-sided adhesive tapes 15, the total area of the adhesive surfaces of the double-sided adhesive tapes 13 is adjusted to adjust the bonding strength between the PDP 1 and the chassis member 3 to the predetermined value, and also to ensure the contact area for heat conduction.

When the total area of the adhesive surfaces of the double-sided adhesive tapes 13 is adjusted, therefore, the contact area for heat conduction can be ensured while adjusting the bonding strength between the PDP 1 and the chassis member 3 to the predetermined value.

Consequently, an external impact force applied to the chassis member 3 is hardly directly transmitted to the PDP 1, and the disassembling work for recycling, and the work of replacing components can be easily conducted.

The foregoing description of the preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A flat display apparatus comprising:

a chassis member; and a flat display panel having a back face which is fixed to the chassis member by adhesive tapes, wherein the adhesive tapes include at least one double-sided adhesive tape and at least one single-sided adhesive tape, and a bonding strength between the display panel and the chassis member is adjusted to a predetermined value by adjusting a total area of adhesive surface of the at least one double-sided adhesive tape together with ensuing a contact area between the display panel and the chassis member for heat conduction.

2. A flat display apparatus according to claim 1, wherein the at least one double-sided adhesive tape is formed by a tape backing having a heat conductivity and a buffer property, the at least one double-sided adhesive tape member with nonwoven fabric is applied to both surfaces of the tape backing so that a adhesive layer is formed on the both surfaces of the tape baking, the at least one single-sided adhesive tape is formed by a tape backing having a heat conductivity and a buffer property, and the at least one double-sided adhesive tape member with nonwoven fabric is applied to only one surface of the tape backing of the at least one single-sided adhesive tape so that an adhesive layer is formed on the only one surface of the tape baking of the at least one single-sided adhesive tape.

3. A flat display apparatus according to claim 2, wherein the tape backing is made of silicone rubber.

* * * * *